United States Patent
Lallement et al.

(10) Patent No.: US 10,317,980 B2
(45) Date of Patent: Jun. 11, 2019

(54) GROUPING POWER SOURCES AND POWER LOADS TO GROUPS THAT SHARE SIMILAR PROPERTIES

(71) Applicant: EATON INDUSTRIES (FRANCE) SAS, Montbonnot St Martin (FR)

(72) Inventors: Dominique Lallement, Grenoble (FR); Emilien Kia, Pontcharra (FR)

(73) Assignee: EATON INTELLIGENT POWER LIMITED, Dublin (IE)

( * ) Notice: Subject to any disclaimer, the term of this patent is extended or adjusted under 35 U.S.C. 154(b) by 977 days.

(21) Appl. No.: 14/408,963

(22) PCT Filed: Jul. 2, 2013

(86) PCT No.: PCT/EP2013/063927
§ 371 (c)(1),
(2) Date: Dec. 18, 2014

(87) PCT Pub. No.: WO2014/006039
PCT Pub. Date: Jan. 9, 2014

(65) Prior Publication Data
US 2015/0362981 A1    Dec. 17, 2015

(30) Foreign Application Priority Data
Jul. 3, 2012    (GB) .................................. 1211742.0

(51) Int. Cl.
*G06F 1/32*         (2019.01)
*G06F 1/3287*       (2019.01)
*H05K 7/14*         (2006.01)
*G05B 15/00*        (2006.01)
*G06Q 50/06*        (2012.01)

(52) U.S. Cl.
CPC .......... *G06F 1/3287* (2013.01); *G05B 15/00* (2013.01); *G06Q 50/06* (2013.01); *H05K 7/1498* (2013.01)

(58) Field of Classification Search
None
See application file for complete search history.

(56) References Cited

U.S. PATENT DOCUMENTS

| | | | |
|---|---|---|---|
| 2003/0074471 A1* | 4/2003 | Anderson | H04L 29/12009 709/245 |
| 2006/0044117 A1 | 3/2006 | Farkas et al. | |
| 2009/0138313 A1* | 5/2009 | Morgan | G06Q 10/06 705/7.23 |
| 2009/0287843 A1 | 11/2009 | Morimura | |
| 2010/0063010 A1 | 3/2010 | Mehta et al. | |
| 2011/0030711 A1 | 2/2011 | Han | |
| 2011/0307115 A1* | 12/2011 | Pereira | G06F 1/3209 700/296 |
| 2012/0072745 A1 | 3/2012 | Ahluwalia et al. | |
| 2013/0212411 A1* | 8/2013 | Nicholson | G06F 1/266 713/310 |

* cited by examiner

*Primary Examiner* — Jason Lin
(74) *Attorney, Agent, or Firm* — Leydig, Voit & Mayer, Ltd.

(57) ABSTRACT

A method of managing a system having a multitude of power sources and power loads, configured for execution in a computing device, the computing device being assigned to the system; and system having a multitude of power sources and power loads, wherein such a managing method is applied to the system.

9 Claims, 3 Drawing Sheets

GROUPING POWER SOURCES AND POWER LOADS TO GROUPS THAT SHARE SIMILAR PROPERTIES

CROSS-REFERENCE TO RELATED APPLICATIONS

This application is a U.S. National Stage application under 35 U.S.C. § 371 of International Application No. PCT/EP2013/063927, filed on Jul. 2, 2013, and claims benefit to British Patent Application No. 1211742.0, filed on Jul. 3, 2012. The International Application was published in English on Jan. 9, 2014, as WO 2014/006039 A1 under PCT Article 21(2).

FIELD

This invention relates to a method of managing a system comprising a multitude of power sources and power loads, configured for execution in a computing device, the computing device being assigned to the system and to a system comprising a multitude of power sources and power loads, wherein such a managing method is applied to the system.

BACKGROUND

As systems grow in complexity with increasing numbers of loads and sources, the management of such systems, for example keeping track of which loads feed from which sources, becomes more difficult. Further, as the practice of remotely monitoring systems increases, keeping track of the physical location of loads becomes more difficult. Moreover, loads and sources may be continuously added, removed, temporarily disconnected, relocated, and reconnected. Thus, the locations of loads and the topology of the connections between loads and sources is a live, dynamic environment.

One example where topology information is useful is in data center applications. As the costs of energy and, in particular, electricity increases, having up-to-date information regarding power topologies and specifically the physical location of the servers and which servers connect to which circuit branches or power points becomes increasingly important.

This information enables data center managers to optimize power consumption via adequate planning, right-sizing of energy supply to data center equipment, power balancing, load shedding, overload protection, efficient problem diagnosis, and so on. Additionally, in some data center applications, managers may be required to maintain up-to-date power topology information in order to monitor reliability and reduce troubleshooting time in case of failure.

Power Line Identification (PLI) is a method that analyses measurements of power consumption or computing activity of server and measurements of power output of power outlets. Such a method is known, for example from US 2011/0307111 A1. The algorithm produces pairs of power sources and power sinks.

In a data center with a very large number of servers and power outlets, applying such a method becomes an issue, as it requires a huge amount of time and huge amount of computing resources to directly treat a large number of servers and outlets, like, for example 1000 of each. The resources and time needed is a nonlinear, approximately quadratic, function of the number of devices.

SUMMARY

An aspect of the invention provides a method of managing a system comprising a plurality of power sources and a plurality of power loads, configured for execution in a computing device, the computing device being assigned to the system, the method comprising: dividing the plurality of sources and the plurality of loads into a plurality of groups of sources and a plurality of groups of loads; and executing the managing of the system for each group separately, wherein the dividing is carried out according to at least one property of the sources and loads, in such a way that the sources and loads of each group share at least one similar property.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
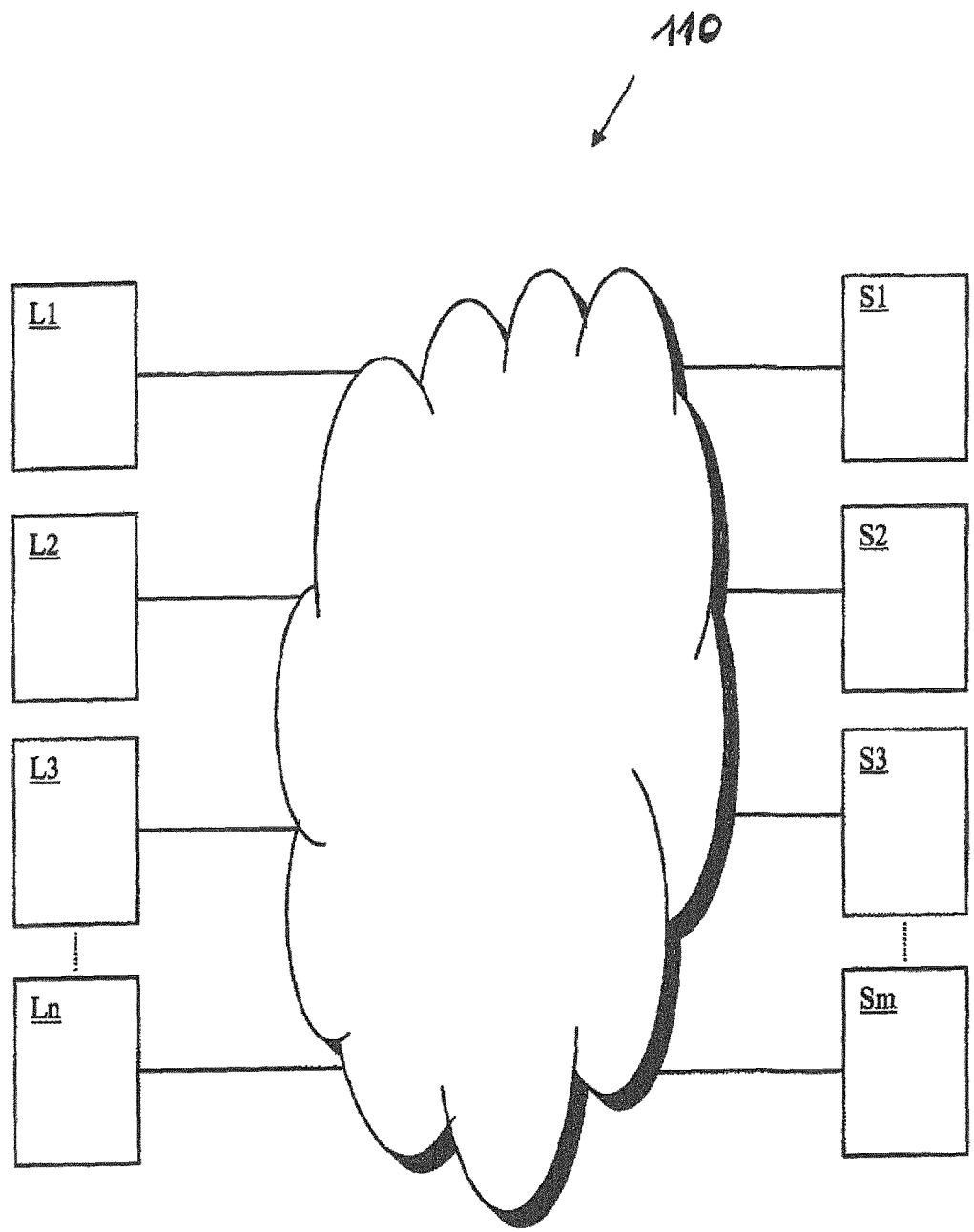
FIG. 1 illustrates a diagram of a system including loads and sources.

One aspect of the invention provides a method which allows to retrieve the topology of large systems with a large number of devices to facilitate the application of known management methods, like for example, the matching of loads and sources.

A method of managing a system comprising a multitude of power sources and power loads, according to the invention, provides that the multitude of sources and loads in a first step is divided into a plurality of groups of sources and loads and in at least one second step the managing of the system is executed for each group separately, wherein the grouping in the first step is executed according to at least one property of the sources and loads, in such a way that the sources and loads of each group share at least one similar property.

A multitude of power sources and loads is meant to comprise a larger number, like for example at least ten loads and ten sources, preferably more than 100 sources and loads. The term plurality of groups is meant to define a lesser number of groups than the number of loads and sources. Preferably, the number of sources and loads is a magnitude of at least ten times bigger than the number of groups. Each source or load of a group shares at least one property with any arbitrary second source or load of the same group which is similar. It is, however, not necessary, that all the sources or loads share the same property which is similar. The similar properties may be identical between two or more sources or loads, as well, but they do not have to. The first step of grouping is based on similar properties of the sources and loads, which means that it is not intended to assign certain loads to fitting sources, in a sense of power consumption. The intention is rather to build up groups of assorted loads and sources sharing at least one similar property, which is preferably not related to power consumption.

It is an advantage of the method according to the invention, that known management methods may be applied to a large system comprising a multitude of loads and sources, group by group, thus avoiding an exponential increase of computing effort necessary for the management methods. Regarding for example the method of matching sources to loads, the computing effort in a data center with 1000 sources and loads is 100 times higher than in a data center of 100 sources and loads, due to the increasing number of arithmetical possibilities that have to be checked. If the larger data center is divided into 10 groups of each 100 sources and loads in the first step, the necessary computing time will be between ten times and twenty times as high as in the smaller data center, and thus a magnitude of five to ten times faster than without grouping the sources and loads. By grouping sources and loads which share at least one similar property, the matching quality is maximised, as many sources and loads are assembled in one group, which would have been matched anyway, due to their similar properties.

It is another advantage of the method according to the invention, that the sophisticated topology of a large data center can be more clearly displayed by using the groups. This can be a great facilitation during fault diagnostic or device exchange operations, for example.

According to a preferred embodiment, the property for executing the grouping is a relative physical proximity of devices comprising the sources and/or loads. The groups are composed of devices which comprise one or more sources and/or loads, the devices of a group being located in a relative physical proximity from each other, which means that proximity of the devices is a preferred property upon which the groups are discriminated.

The invention thus proposes to assort such devices into one group that are particularly supposed to be located in the same area of a data center, for example. Each group is composed of different devices, like servers and power outlets. Because of being located in the same area, like, for example, in the same rack or rack row, the devices will possibly have a power relation.

Many criteria may be used to estimate the relative proximity of devices. Applying such criteria will permit to define physical proximity with a certain level of probability. Grouping can be done manually, but it will require lot of headcount and time. Preferably, a computation method is applied that combines different criteria in order to automatize the generation of groups. The step of grouping could be applied advantageously during commissioning of the devices of a system, and additionally, at any time later, for example when additional devices are installed or moved.

According to a preferred embodiment, the proximity of devices is estimated automatically. Furthermore preferable, one or any combination of device criteria are interpreted for the estimation, each interpreted criterion particularly being evaluated for each device with a level of confidence. The level of confidence preferably rises with a degree of similarity of each criterion compared to the corresponding criteria of other devices of the group.

Properties of devices, like a UPS, a PDU, a server, which properties may be used as criteria could be identified by using various pieces of data, like a device name, a location name, an IP address, an asset property like ID, a system time zone or a system language. Further, each device could have specific electrical parameters like a nominal or actual value of power voltage or a nominal or actual value of power frequency. Furthermore, each device could provide specific environmental measurements, like ambient temperature and humidity. Each device could further include some wireless or visual identification tag. To acquire the device properties, such parameter and properties could be read directly on device, or provided by a power management tool, a server management tool, an infrastructure management tool or an environmental management tool.

According to another preferred embodiment, the evaluated criteria are weighted according to a set of rules. Advantageously, more reliable criteria can be weighted higher than other criteria. Further, known rules according to the data center, for example, are preferably applied to estimate proximity. Known rules may be for example: naming rules of asset properties, naming rules of device and location, IP addressing rules. Advantageously, if the rules for device naming or IP addressing in a data center are known, those criteria which follow the known rules are more reliable than other criteria and thus may advantageously be weighted higher. Furthermore preferable, sets of data are analyzed to define proximity, those sets particularly being: lists of predefined association in location, lists of ID tags acquired in the same geographical zone, lists of pairing loads and sources identified before.

According to a further preferred embodiment, in the second step, the sources of a group are automatically matched to the loads of a group, wherein the matching is executed according to a power consumption or activity of the loads and a capacity or activity of the sources. The matching of sources to loads is thus performed group by group.

After the groups have been defined, the PLI algorithm or matching method that discovers electrical links between devices is advantageously applied to each group with increased efficiency, because, for example, it runs faster, produces less error, and uses less resources. The method of automatically matching sources to loads, refers to any one of the methods disclosed in U.S. Pat. No. 2011/0307111 A1, which is incorporated by reference.

According to a furthermore preferred embodiment, an activity and properties monitor receives two types of information: a first set of load activity data representing the load activity over a time period and/or source activity data representing the source activity over the time period; and a second set of properties of the devices, wherein the source activity data and/or the load activity data and/or the properties of devices are stored in a data store operably connected to the activity monitor, and wherein the grouping operation and/or the matching operation is executed by a computer engine operably connected to the activity and properties monitor and/or the data store.

According to a further preferred embodiment, in the second step, a graphical representation of the system is generated, wherein the plurality of groups is used as an organisational structure of the sources and loads.

With a large number of devices it is very complex to clearly represent graphically the topology of a data center. Using groups of devices advantageously permits to represent this topology group by group. Opening a group image will permit to display details more clearly.

Another object of the invention is a system comprising a multitude of power sources and power loads, wherein the managing method according to the invention is applied to the system, which is adapted to divide the multitude of sources and loads into a plurality of groups of sources and loads, according to at least one property of the sources and loads, the sources and loads of each group sharing at least one similar property.

According to a preferred embodiment, it is provided that the multitude of sources and loads to be matched, is divided into groups in a first step and the system is configured to perform the matching of sources to loads group by group in a second step.

The system advantageously facilitates an automatic matching of loads to sources, the system comprising an activity and properties monitor configured to receive two types of information: a first set of load activity data representing the load activity over a time period and/or source activity data representing the source activity over the time period; and a second set of properties of the devices, wherein the source activity data and/or the load activity data and/or the properties of devices are stored in a data store operably connected to the activity and properties monitor, and wherein the grouping operation and/or the matching operation is executed by a computer engine operably connected to the activity and properties monitor and/or the data store.

Figure 2:
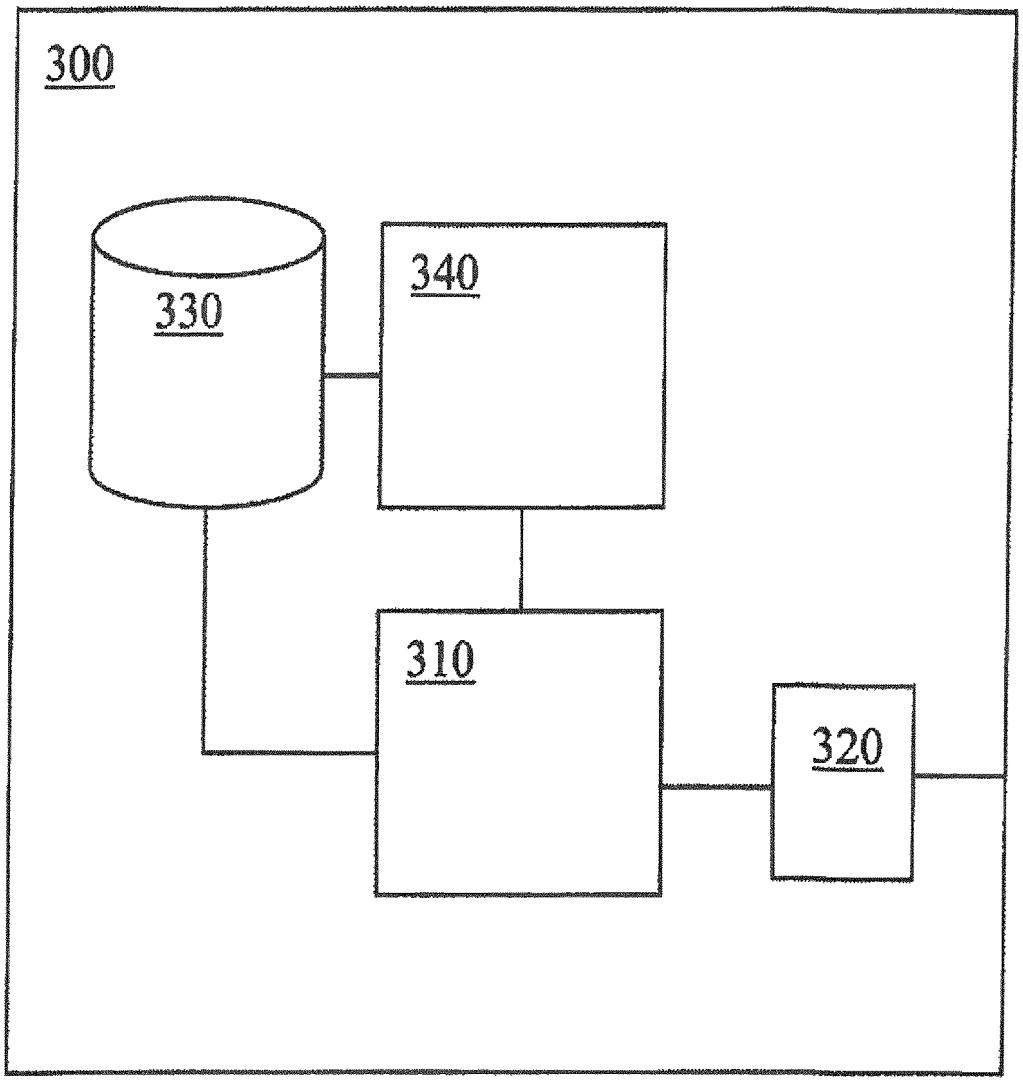
FIG. 2 illustrates a functional block diagram of a computing device for executing the method according to the invention.

FIG. 1 illustrates a diagram of a system 110 including n loads L1-Ln and m sources S1-Sm. The loads L1-Ln are fed from the sources S1-Sm and therefore each load connects to at least one source. However, it is not clear which loads connect to which sources. As systems, such as system 110 grow in complexity with increasing numbers of loads and sources, keeping track of which loads are connected to which sources and keeping track of the physical location of the loads becomes more difficult. According to the invention, a method of managing the system 110 comprising a multitude of power sources S1-Sm and power loads L1-Ln is provided, the multitude of sources S1-Sm and loads L1-Ln being divided into a plurality of groups of sources S1-Sm and loads L1-Ln, according to at least one property of the sources S1-Sm and the loads L1-Ln, the sources S1-Sm and the loads L1-Ln of each group sharing at least one similar property The system 110 further includes a computing device 300 depicted in FIG. 2 in a functional block diagram. The computing device 300 is operably connected to the loads L1-Ln and to the sources S1-Sm. The computing device 300 receives load activity data from the loads L1-Ln and source activity data from the sources S1-Sm. Based on the load activity data and the source activity data, and assuming that there is negligible energy storage at the loads, the computing device 300 can automatically match loads to sources and hence determine the topology of the system 110. The computing device 300 includes an activity and properties monitor 310 configured to receive the load activity data and the source activity data and the properties of devices.

The properties of devices acquired by properties monitor 310 could be various pieces of data like: device name, location name, IP address, asset property identification, system time zone, system language. Each device could also have specific electrical parameter like nominal or actual value of power voltage, nominal or actual value of power frequency. Each device could also have specific environment measurements like temperature and humidity. Each device could also include some wireless or visual identification tag.

In the illustrated embodiment, the activity and properties monitor 310 is operably connected to an I/O interface 320 configured to interact with a network including the loads and sources directly on device and external monitoring pieces of software like a power management tool, a server management tool, an infrastructure management tool, or an environment management tool. The computing device 300 further includes a data store 330 operably connected to the activity and properties monitor 310 and the computer engine 340. The data store 330 stores the source activity data and the load activity data. The computing device 300 also includes the computer engine 340 operably connected to the activity and properties monitor 310 or the data store 330 and configured to automatically group and match sources to loads based on the source activity data and the load activity data. The matching engine 340 works under two types of assumption.

The first assumption is a functional relationship exists between the source activity data and the load activity data corresponding to sources and loads, respectively, which are connected to each other in the system. The relationship is preferably found by the PLI method described in the state of the art.

The second assumption is based on evaluation by using various criteria based on properties acquired by monitor 310 and interface 320, like: similarity of device name, similarity of location name, similarity of asset ID, similarity of IP addresses, similarity of network response delay, e.g. by using a ping function, similarity of network path, e.g. by using a trace root function, similarity of environment measurements, similarity of electrical nominal or actual values. Some other additional rules could be used to evaluate proximity like naming rule of asset properties, naming rules of device and location, IP addressing rules. Some already aggregated data could be used to evaluate proximity like of predefined association in the same location, or a list of ID tag acquired in the same geographical zone.

Figure 3A:
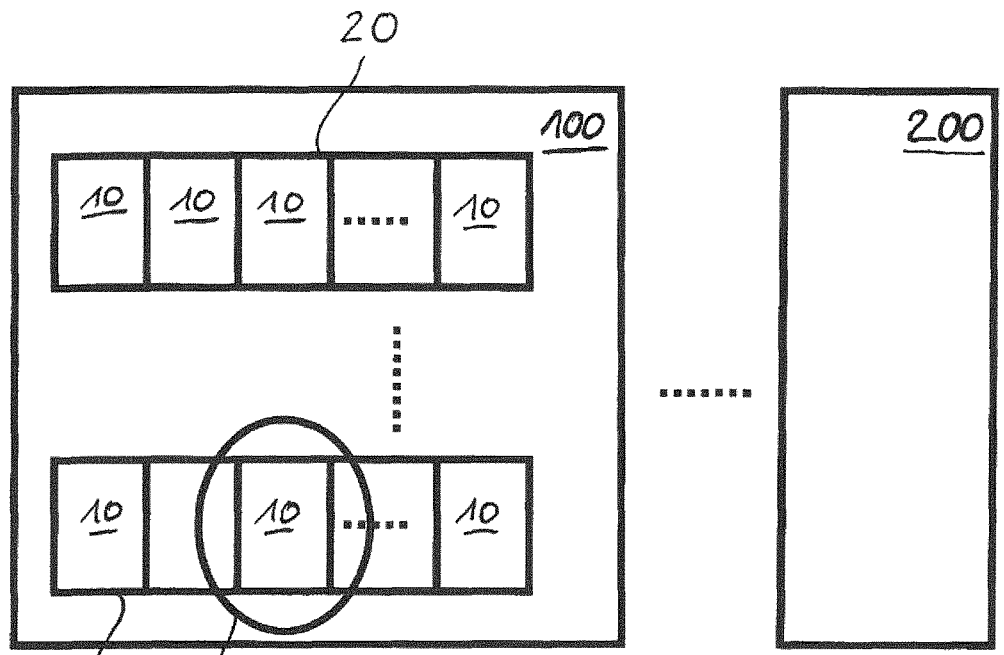
FIG. 3A shows an example of a scheme of a data center.
Figure 3B:
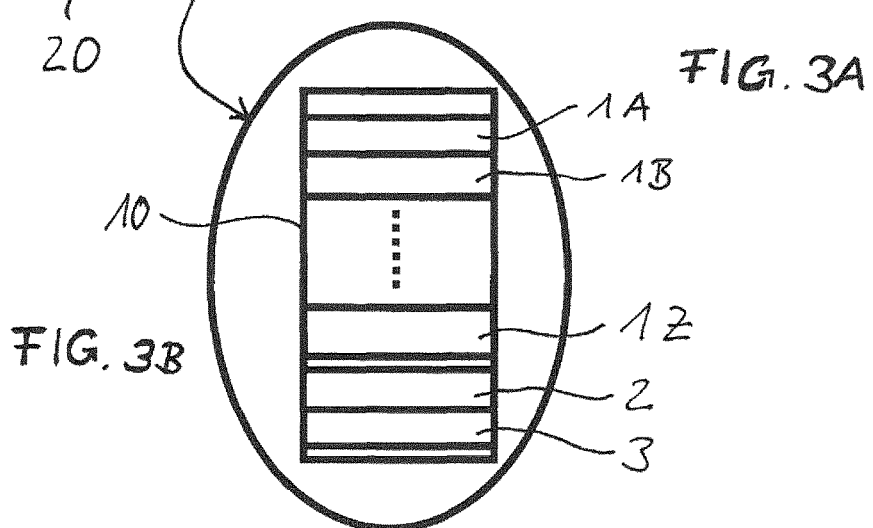
FIG. 3B shows a detail of the data center of FIG. 3A.

In FIG. 3A, a typical scheme of a data center is shown. Different devices, like servers 1A, 1B, 1Z, power distribution units 2 and uninterruptible power supplies 3 are located together, for example in a rack 10, one of which is depicted in FIG. 3B on a greater scale. A number of racks is connected to a row of racks 20, and the data center comprises a number of rows 20. In huge systems, the data center is further divided into a multitude of subunits 100, 200.

The present invention makes use of the assumption, that the loads of the devices 1A, 1B, 1Z inside one rack 10 are probably fed from the sources 2, 3 of the devices inside that rack 10, rather than from a source in a different rack or even in a different row or subunit.

A huge number of loads and sources is thus divided into groups in a first step and the matching operation in the second step is delimited to the groups, which are handled independently of each other. The grouping is preferably executed automatically by estimation of proximities of the devices. Each device criterion is evaluated for each device with a certain level of confidence. The various criteria evaluations are weighted in accordance with pertinent rules applicable to this data center. By using a mathematical approach like Bayesian method, the system combines such individual criteria quotation in order to define groups in the form of zones of proximity.

Figure 4:
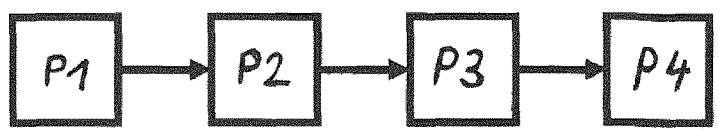
FIG. 4 shows a flow diagram to explicate the discrimination of groups according to the invention.

An example of such a computation is shown in FIG. 4. In step P1, a number of criteria are selected (C1, C2, C3 . . . Ck). For each criterion a group distance DG(C) is defined.

In step P2, for each couple of devices X and Y, a distance associated with a particular criterion is computed: D(X,Y,C).

In step P3, for all the pairs, only those with an associated distance D(X,Y,C) that does not exceed the defined group distance DG(C) are considered in the same group G(C, n). The number of groups to be defined is not limited.

In step P4, each group computed in step P3 with criteria c(G(C, n)) is compared with all of the other groups derived by different criteria. Intersections of adjacent groups that comprise identical devices provide final groups.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

REFERENCE NUMERALS 1A, 1B . . . 1Z Server
2 Power distribution unit PDU
3 Uninterruptible power supply UPS
10 Rack
20 Row
100, 200 Subunits
110 System
300 Computer device
310 Activity and Properties monitor
320 Input/output unit
330 Data store
340 Computer engine
L1-Ln Loads
S1-Sn Sources
P1 . . . P4 Step 1-4

The invention claimed is:

1. A method of managing a system comprising a multitude of power sources and a multitude of power loads, configured for execution in a computing device, the computing device being assigned to the system, the method comprising:
dividing the multitude of sources and the multitude of loads into a plurality of groups of sources and a plurality of groups of loads according to at least one property of the sources and loads in such a way that the sources and loads of each group share at least one similar property; and
executing the managing of the system for each group separately,
wherein the at least one property for executing the grouping comprises a relative physical proximity of devices comprising the sources, the loads, or the sources and the loads,
wherein the relative physical proximity of devices is estimated automatically, to obtain a proximity estimation,
wherein one criterion or a combination of criteria which are attributed to the device are interpreted for the proximity estimation, and
wherein each interpreted criterion is evaluated for each device with a level of confidence.

2. The method of claim 1, wherein the level of confidence rises with a degree of similarity of each criterion compared to a corresponding criterion of other devices of the group.

3. The method of claim 1, wherein evaluated criteria are weighted according to a set of rules.

4. The method of claim 1, wherein, in the executing, the sources of a group are automatically matched to the loads of a group, in a matching, and
wherein the matching is executed according to a power consumption or activity of the loads and a capacity or activity of the sources.

5. The method of claim 4, further comprising:
receiving, at an activity and properties monitor, two types of information including:
a first set comprising at least one of load activity data representing a load activity over a time period, and source activity data representing a source activity over the time period, and
a second set comprising properties of the devices; and
storing at least one of the source activity data, the load activity data, and the properties of devices in a data store operably connected to the activity and properties monitor; and
executing at least one of a grouping operation and a matching operation by a computer engine operably connected to at least one of the activity and properties monitor and the data store.

6. The method of claim 1, wherein the executing includes generating a graphical representation of the system,
wherein the plurality of groups is used as an organizational structure of the sources and loads.

7. The system, comprising:
the multitude of power sources; and
the multitude of power loads,
wherein the system is configured to divide the multitudes of sources and loads into the plurality of groups of sources and the plurality of groups of loads according to at least one property of the sources and loads, the sources and loads of each group sharing at least one similar property, according to the method of claim 1.

8. The method of claim 1, wherein, in the executing, the sources of a group are automatically matched to the loads of a group, in a matching, and
wherein the matching is executed according to an activity of the loads and an activity of the sources.

9. The method of claim 1, wherein, in the executing, the sources of a group are automatically matched to the loads of a group, in a matching, and
wherein the matching is executed according to a power consumption of the loads and a capacity of the sources.

* * * * *